(12) United States Patent
Farrar et al.

(10) Patent No.: US 6,949,839 B2
(45) Date of Patent: Sep. 27, 2005

(54) ALIGNED BURIED STRUCTURES FORMED BY SURFACE TRANSFORMATION OF EMPTY SPACES IN SOLID STATE MATERIALS

(75) Inventors: Paul A. Farrar, South Burlington, VT (US); Joseph E. Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/277,043

(22) Filed: Oct. 22, 2002

(65) Prior Publication Data

US 2003/0042627 A1 Mar. 6, 2003

Related U.S. Application Data

(62) Division of application No. 09/736,247, filed on Dec. 15, 2000, now Pat. No. 6,579,738.

(51) Int. Cl.[7] .................... H01L 23/544; H01L 23/48
(52) U.S. Cl. .................... 257/797; 257/667; 257/773; 257/774; 257/775; 257/776; 257/920; 174/262; 438/401; 438/462; 438/620; 438/33
(58) Field of Search .................... 257/797, 667, 257/773–776, 920; 174/250, 261, 262, 263; 438/68, 401, 462, 620

(56) References Cited

U.S. PATENT DOCUMENTS

| | | | |
|---|---|---|---|
| 5,065,765 A | * 11/1991 | Eckerle et al. | 600/485 |
| 5,538,819 A | 7/1996 | DeMarco et al. | |
| 5,712,189 A | 1/1998 | Plumton et al. | |
| 5,739,575 A | * 4/1998 | Numano et al. | 257/513 |
| 5,747,842 A | 5/1998 | Plumton | |
| 5,889,298 A | 3/1999 | Plumton et al. | |
| 5,920,121 A | 7/1999 | Forbes et al. | |
| 5,937,286 A | 8/1999 | Abiko | |
| 5,943,581 A | * 8/1999 | Lu et al. | 438/386 |
| 6,025,261 A | 2/2000 | Farrar et al. | |
| 6,054,361 A | * 4/2000 | Tan et al. | 438/401 |
| 6,080,635 A | * 6/2000 | Jang et al. | 438/401 |
| 6,081,040 A | 6/2000 | Okuda et al. | |
| 6,093,640 A | * 7/2000 | Hsu et al. | 438/631 |
| 6,100,176 A | 8/2000 | Forbes et al. | |

(Continued)

OTHER PUBLICATIONS

Levine et al; Feb. 1997 "Formation of micro on substrate trench at least layer of substrate surface,forming tranch at least layer of substrate second layer over first layer,and forming via hole on second layer that reaches micropipe"; IBM; 2001–353702 Derwent.*

F.A. Nichols, et al.—"Surface– (Interface–) and Volume–Diffusion Contributions to Morphological Changes Driven by Capillarity," Transactions of the Metallurgical Society of AIME, vol. 233, Oct. 1965, pp. 1840–1848.

Tsutomu Sato, et al.—"A New Substrate Engineering for the Formation of Empty Space in Silicon (ESS) Induced by Silicon Surface Migration," IEEE 1999, pp. 517–520.

U.S. Appl. No. 09/069,346, filed Apr. 29, 1998.

*Primary Examiner*—Alexander Oscar Williams
(74) *Attorney, Agent, or Firm*—Dickstein Shapiro Morin & Oshinsky LLP

(57) ABSTRACT

A method of aligning a plurality of empty-spaced buried patterns formed in semiconductor monocrystalline substrates is disclosed. In an exemplary embodiment, high-temperature metal marks are formed to include a conductive material having a melting temperature higher than an annealing temperature used to form such empty-spaced buried patterns. The high-temperature metal marks are formed prior to the formation of the empty-spaced buried patterns formed in a monocrystalline substrate, so that the empty-space buried patterns are aligned to the marks. Subsequent semiconductor structures that are formed as part of desired semiconductor devices can be also aligned to the marks.

2 Claims, 12 Drawing Sheets

U.S. PATENT DOCUMENTS

| | | |
|---|---|---|
| 6,121,126 A | 9/2000 | Ahn et al. |
| 6,133,111 A * | 10/2000 | Sur et al. ............... 438/401 |
| 6,136,662 A | 10/2000 | Allman et al. |
| 6,157,087 A * | 12/2000 | Zhao et al. ............ 257/797 |
| 6,215,197 B1 * | 4/2001 | Iwamatsu ............... 257/797 |
| 6,228,744 B1 * | 5/2001 | Levine et al. .......... 438/422 |
| 6,303,460 B1 * | 10/2001 | Iwamatsu ............... 438/401 |
| 6,303,472 B1 | 10/2001 | Queirolo et al. |
| 6,352,904 B2 * | 3/2002 | Tan et al. ............... 438/401 |
| 6,352,909 B1 | 3/2002 | Usenko |
| 6,383,924 B1 * | 5/2002 | Farrar et al. ............ 438/667 |
| 6,417,072 B2 | 7/2002 | Coronel et al. |
| 6,462,428 B2 * | 10/2002 | Iwamatsu ............... 257/797 |
| 6,576,529 B1 * | 6/2003 | Boulin et al. ........... 438/401 |
| 6,579,738 B2 * | 6/2003 | Farrar et al. ............ 438/33 |
| 6,667,221 B2 * | 12/2003 | Kitazawa et al. ....... 438/401 |
| 6,696,746 B1 * | 2/2004 | Farrar et al. ............ 257/621 |
| 6,740,564 B2 * | 5/2004 | Kamoshima et al. ... 438/401 |
| 2002/0005594 A1 * | 1/2002 | Iwamatsu ............... 257/797 |
| 2002/0072195 A1 * | 6/2002 | Anma et al. ............ 438/401 |
| 2003/0102576 A1 * | 6/2003 | Teramoto ............... 257/797 |

* cited by examiner

ALIGNED BURIED STRUCTURES FORMED BY SURFACE TRANSFORMATION OF EMPTY SPACES IN SOLID STATE MATERIALS

This application is a divisional of application Ser. No. 09/736,247, filed Dec. 15, 2000, which matured into U.S. Pat. No. 6,579,738 issued on Jun. 17, 2003, the subject matter of which is incorporated by reference herein.

FIELD OF THE INVENTION

The present invention relates to semiconductor devices and methods of making such devices. More particularly, the invention relates to solid state materials and to a novel method of aligning buried structures formed in such solid state materials.

BACKGROUND OF THE INVENTION

The fabrication of integrated circuits (IC) devices on semiconductor wafers include various steps during which patterns are transferred from photolithographic masks on the wafers. The masking step involves an etching step and defines predefined areas to be exposed on the wafer for subsequent processing, for example, oxidation, metallization, or doping, among others. This photolithographic process is repetitively performed until desired patterns of materials are formed on the semiconductor wafer.

As the dimensions of these patterns become increasingly smaller, it is strictly required to accurately align the patterns previously formed on the semiconductor wafer with a pattern that is to be subsequently formed, and to minimize the misalignment between IC layers. To accurately carry out this process, the semiconductor industry employs alignment marks which are provided at predetermined position on the surface of a wafer, so that relative positioning between patterns is performed referring to these marks.

Typically, alignment marks are topographical patterns, such as squares, crosses or chevrons, among others, which are formed by etching into the wafer to provide slit patterns constituted of longitudinal indentations over specific intervals at semiconductor surface, an insulating layer or other layers of a semiconductor substrate.

The formation of alignment marks is typically executed simultaneously with, or after, other processes, for example the formation of metallization layers over a semiconductor substrate. In this case, the etching of the alignment mark must be conducted with extreme care, to avoid overetching of the substrate and/or of the underlying layers, which could be metal layers. Another problem posed by the formation of the alignment marks under these circumstances is the readability of the mark, particularly when an oxide layer covers the mark. As known in the industry, the formation of semiconductor devices requires, in most cases, a series of oxidation steps to form various oxide layers at different stages of processing. For example, new isolation processes such as shallow trench isolation (STI) necessitate a thick oxide layer formed over both the wafer and the alignment marks. When the thick oxide layer is later polished, typically by chemical mechanical polishing, to create a planar surface, the alignment marks on a new overlying layer on the wafer are flattened after planarization, causing alignment target reading problems.

Another problem encountered by conventional alignment processes relates to the alignment of various buried structures. As the semiconductor industry is exploring new ways of increasing the amount of active surface area on the integrated circuit chips, particularly on those employing monocrystalline semiconductor substrates, attempts to create and develop new technologies have been made continuously. For example, one technology proposed by the semiconductor industry is the so-called Silicon-On-Insulator (SOI) process, wherein oxygen atoms are implanted at high dose and energy to form a silicon dioxide insulating layer between the upper surface of the original monocrystalline substrate and the bottom bulk portion of the same substrate. Although the SOI devices have many advantages, such as reduced parasitic capacitance due to the buried insulating layer, the process is relatively expensive because of the high costs of implanting the oxygen atoms and curing of the implant-induced defects. Further, buried structures such as SOI devices are completely covered by the reformed monocrystalline semiconductor substrate and thus they become essentially non-readable for alignment purposes.

Accordingly, there is a need for an improved method of increasing the available active surface area on integrated circuit chips fabricated on monocrystalline substrates by forming buried structures within such substrates. There is also a need for a more advantageous alignment process for such buried structures formed in monocrystalline superconducting substrates. There is further a need for an improved metallization scheme which facilitates the formation of active devices on SOI substrates and on the more novel Silicon-On-Nothing (SON) substrates, as well as a need for accurate alignment of such metallization scheme with subsequently formed layers.

BRIEF SUMMARY OF THE INVENTION

The present invention provides a method of forming an alignment mark for aligning a plurality of empty-spaced patterns formed in semiconductor monocrystalline substrates. According to an exemplary embodiment, alignment metal marks are formed of a conductive material having a melting temperature higher than the annealing temperature used to form the empty-spaced patterns. The alignment marks are formed prior to the formation of empty-spaced buried patterns formed in a monocrystalline substrate, so that the empty-space buried patterns are aligned to the marks. Holes could be next formed in the monocrystalline substrate to connect surfaces of the substrate with the previously formed empty-space patterns. The whole assembly is subsequently exposed to an oxidizing atmosphere so that the inner surfaces of the empty-space patterns are oxidized. The empty-space patterns could then be filled with a suitable conducting material to form, for example, buried conductors and/or buried plate patterns. Subsequent semiconductor structures that are formed as part of desired semiconductor devices can be also aligned to the marks. This way, a proper alignment of the semiconductor devices to the buried conductors and/or buried plate patterns is achieved.

DETAILED DESCRIPTION OF THE INVENTION

Figure 1:
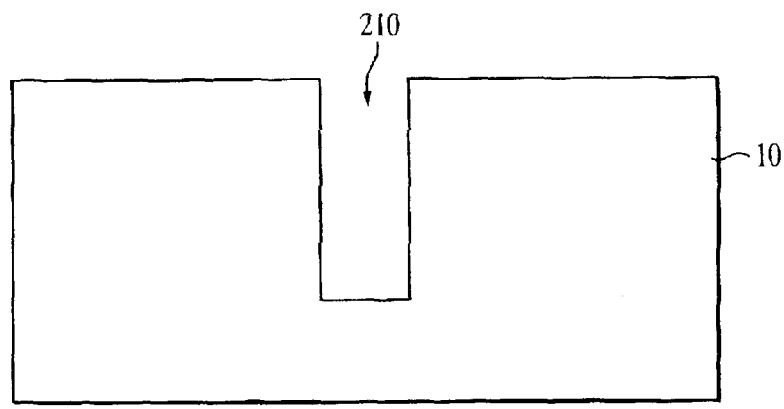
FIG. 1 illustrates a cross-sectional view of a silicon substrate at a preliminary step of processing undertaking a sequence of steps for the formation of an alignment mark in accordance with a method of the present invention.

In the following detailed description, reference is made to various exemplary embodiments for carrying out the invention. These embodiments are described with sufficient detail to enable those skilled in the art to practice the invention, and it is to be understood that other embodiments may be employed, and that structural, electrical and process changes may be made, and equivalents substituted, without departing from the invention. Accordingly, the following detailed description is exemplary and the scope of the present invention is defined by the appended claims.

The term "substrate" used in the following description includes any semiconductor-based structure having an exposed surface in which the structure of this invention may be formed. The term "substrate" is to be understood as including substrates formed of silicon, silicon-on-insulator, doped and undoped semiconductors, epitaxial layers of silicon supported by a base semiconductor foundation, and other semiconductor and dielectric structures. Furthermore, when reference is made to a substrate in the following description, previous process steps may have been utilized to form regions or junctions in the base semiconductor structure or foundation.

The following illustration is for a particular embodiment in a silicon structure. However, it should be apparent to one skilled in the art that a similar embodiment is possible in any semiconductor structure.

Referring now to the drawings, where like elements are designated by like reference numerals, FIGS. 1–21 illustrate exemplary embodiments of a method of aligning buried silicon structures 100 comprising buried conductor patterns formed in accordance with the present invention. FIGS. 1–6 illustrate the formation of a series of high-temperature alignment marks 200 formed in a silicon substrate 10 according to an embodiment of the present invention. FIGS. 7–21 illustrate the formation of empty-spaced patterns in the silicon substrate 10, on which the buried conductor patterns of the present invention will be formed and aligned relative to the alignment marks 200.

Reference in now made to FIG. 1, which illustrates a cross-sectional view of a silicon substrate 10 within which square alignment marks 200 (FIGS. 5–6) are formed according to exemplary embodiments of the present invention. For simplicity, the method of the present invention will be described above with reference to the formation of only one square alignment mark 200, but it must be understood the invention contemplates the formation of a plurality of such alignment marks. Further, although the present invention will be described with reference to the formation of a square alignment mark, it must be understood that the shape, geometry and configuration of the alignment mark is not limited to that of a square, and other geometries, such as crosses or chevrons, for example, may be used also.

As shown in FIG. 1, the silicon substrate 10 is patterned and etched by known photolithography techniques to form a trench 210 in the silicon substrate 10. The trench 210 is etched to a depth of about 1,000 Angstroms to about 10,000 Angstroms, more preferably of about 2,000 Angstroms. The trench 210 is also etched to a width of about one-third of the depth, or of about 300 Angstroms to about 3,000 Angstroms, in the example given.

Figure 2:
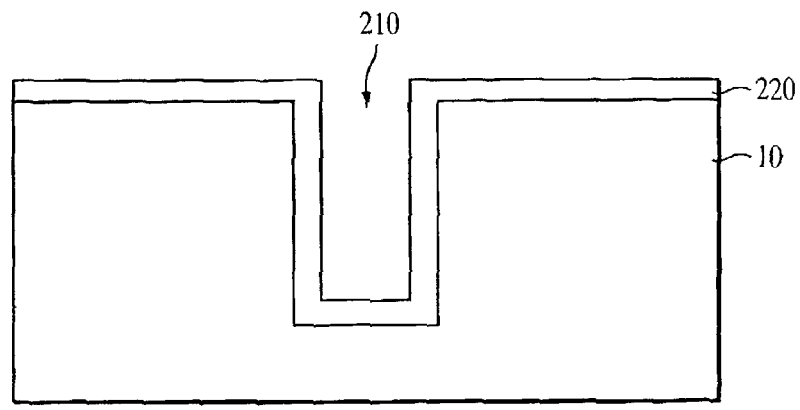
FIG. 2 illustrates a cross-sectional view of the alignment mark of FIG. 1 at a stage of processing subsequent to that shown in FIG. 1.

Subsequent to the formation of the trench 210, the silicon substrate 100 is oxidized to thermally grow a silicon oxide layer 220 into the trench 210 and over the surface of the silicon substrate 10, as illustrated in FIG. 2. The thermal oxidation of the silicon substrate 10 could take place, for example, in an oxygen ($O_2$) or water ($H_2O$) vapor ambient, at temperatures of about 750° C. to about 1000° C. depending on the desired oxidation rate. This way, the silicon oxide layer 220 is formed to a thickness of about 100 Angstroms to about 500 Angstroms, more preferably of about 250

Angstroms. The silicon oxide layer 220 acts as a barrier layer to slow down the diffusion of metal atoms from a subsequently deposited metal film, the formation of which will be described in more detail below. In addition, the silicon oxide layer 220 also enhances the adherence of the metal film to the silicon substrate 10.

Figure 3:
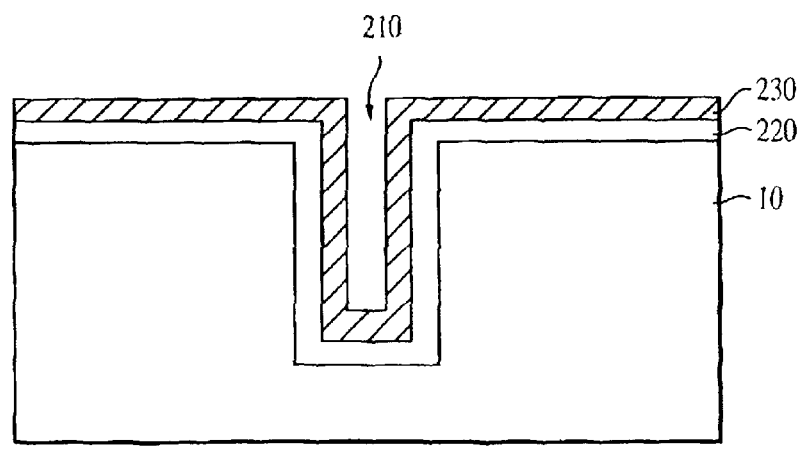
FIG. 3 illustrates a cross-sectional view of the alignment mark of FIG. 1 at a stage of processing subsequent to that shown in FIG. 2.
Figure 5:
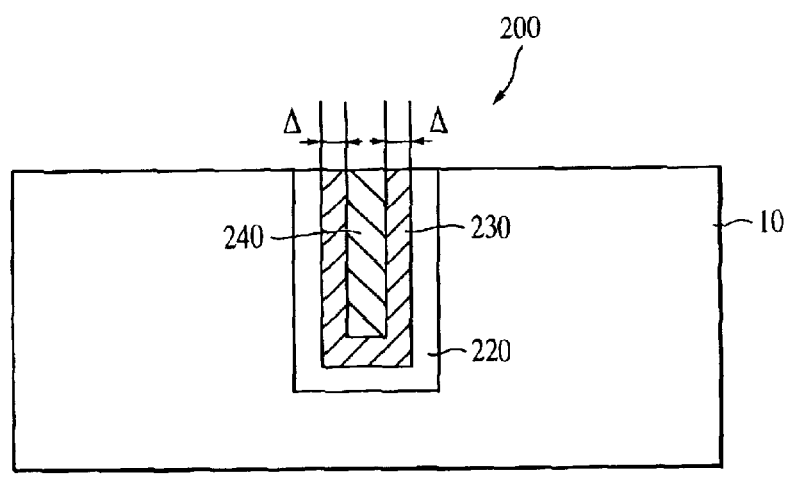
FIG. 5 illustrates a cross-sectional view of the alignment mark of FIG. 1 at a stage of processing subsequent to that shown in FIG. 4.
Figure 6:
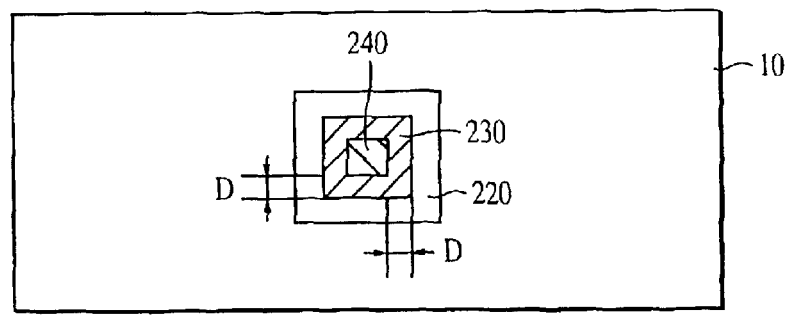
FIG. 6 illustrates a top view of the alignment mark of FIG. 1 at a stage of processing subsequent to that shown in FIG. 5.
Figure 7:
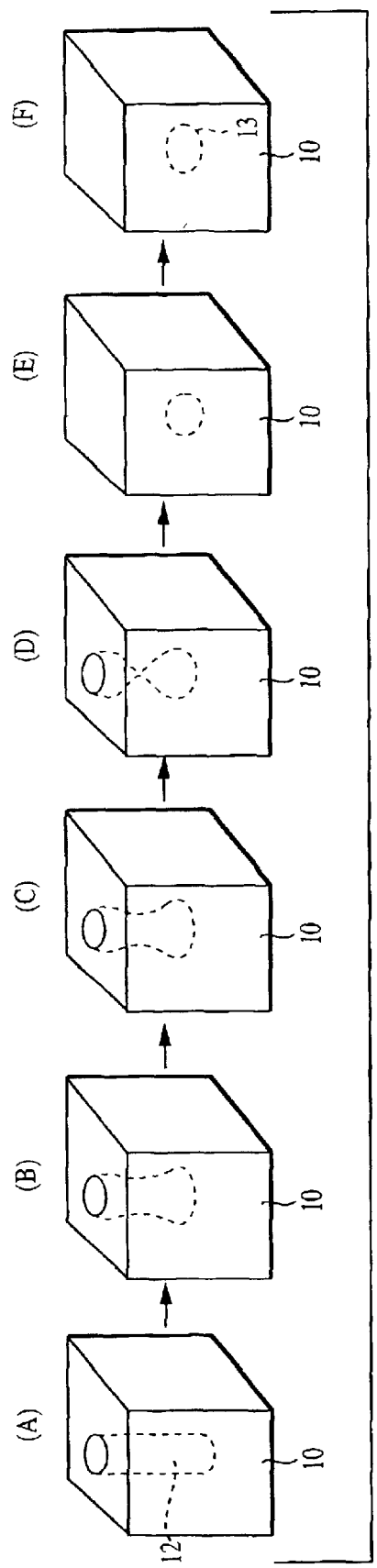
FIGS. 7(a)–(f) illustrate a portion of a silicon substrate undertaking a sequence of steps for single-shaped sphere formation.
Figure 8:
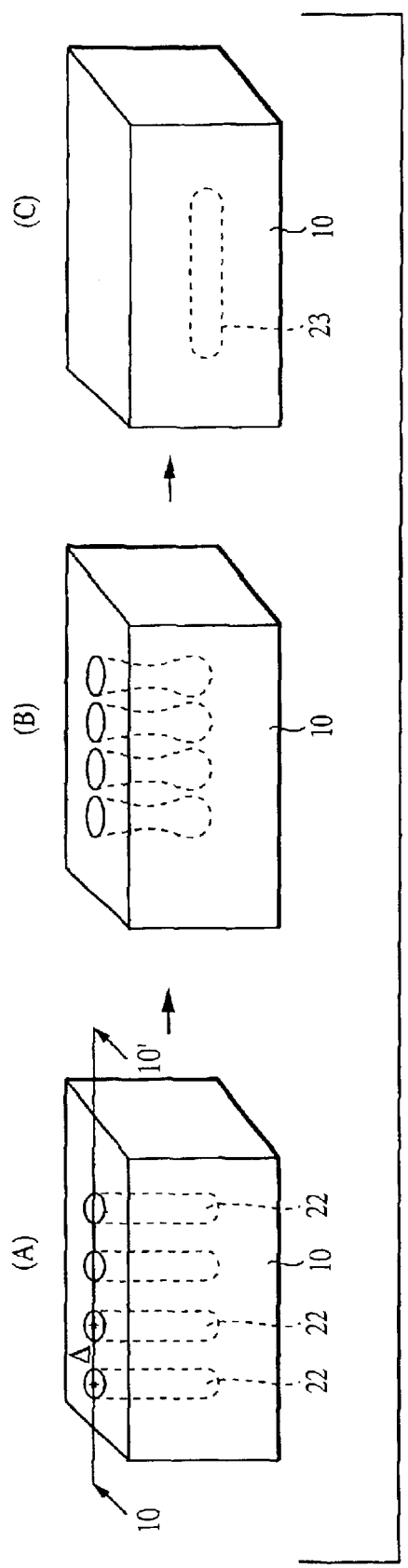
FIGS. 8(a)–(c) illustrate a portion of a silicon substrate undertaking a sequence of steps for single pipe-shaped empty space formation, performed in accordance with a method of aligning a buried pattern of the present invention.
Figure 9:
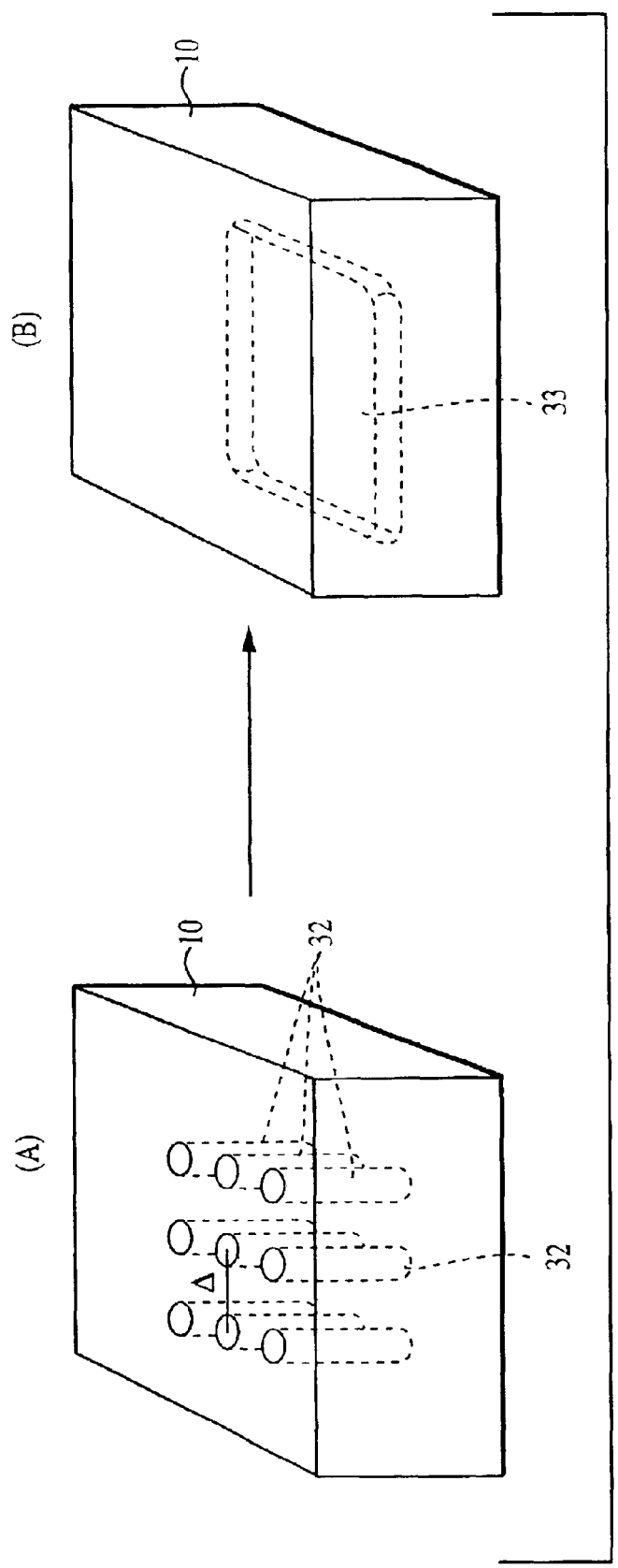
FIGS. 9(a)–(b) illustrate a portion of a silicon substrate undertaking a sequence of steps for plate-shaped empty space formation, performed in accordance with a method of aligning a buried pattern of the present invention.
Figure 10:
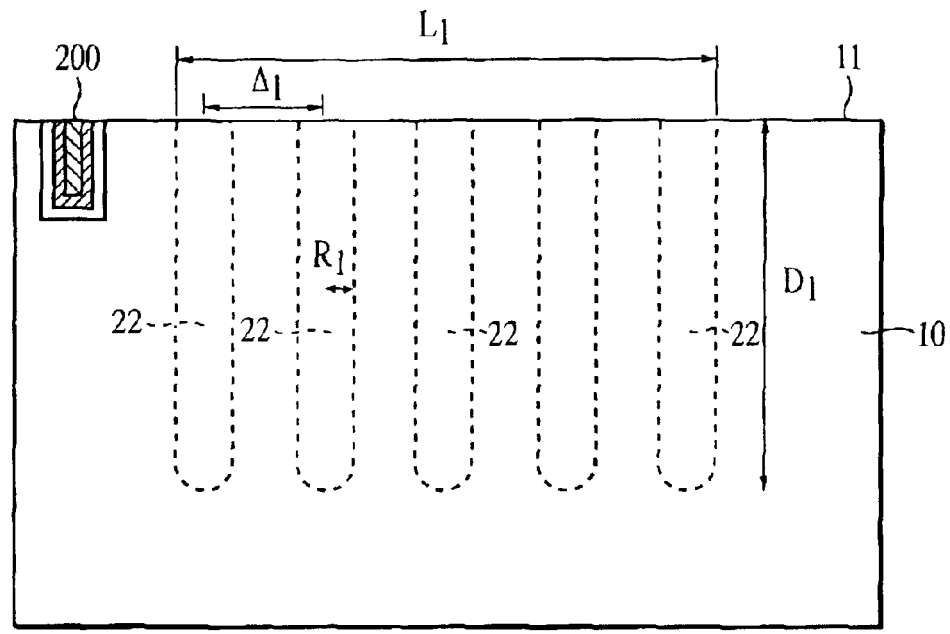
FIG. 10 is a cross-sectional of the silicon structure of FIG. 8, taken along line 10–10 ", at an intermediate stage of processing and in accordance with a first embodiment of the invention, and depicting the alignment mark of FIG. 5.

Next, as illustrated in FIG. 3, a high-temperature conductive material layer 230 is formed overlying the silicon oxide layer 220 and filling partially the trench 210. The conductive material layer 230 is formed to a thickness of about 50 Angstroms to about 500 Angstroms, more preferably of about 100 Angstroms. The thickness of the conductive material layer 230 determines the dimensions of alignment edge D (FIGS. 5–6). For example, if an alignment edge of about 100 Angstroms is desired, then the thickness of the conductive material layer 230 is about 100 Angstroms. In any event, the conductive material layer 230 may be blanket deposited by a known PVD, CVD, or a combination of these techniques. Alternatively, the conductive material layer 230 may be deposited by a plating technique or by using plasma or reactive sputtering.

In a preferred embodiment of the invention, the conductive material layer 230 is formed of a conductive metal with a high-temperature melting point. A characteristic of the conductive material layer 230 is that it must sustain temperatures higher than 1100° C., which are necessary for the formation of the buried structures 100 (FIG. 20) described in more detail below. For example, metals such as iridium (Ir) or tungsten (W), which have high-temperature melting points (melting point of Ir is about 2410° C. and that of W about 3410° C.±20° C.), are best candidates for the conductive material layer 230. If the preferred material for the conductive material layer 230 is iridium, for example, the diffusion of iridium atoms from the iridium layer 230 is prevented by the oxide layer 220 which acts as a barrier layer as well as an adhesion layer.

Although iridium and tungsten are preferred, other metals or combinations of such metals may be used also, as long as they retain a melting temperature higher than 1100° C. As such, molybdenum (Mo) (melting point of about 2617° C.), tantalum (Ta) (melting point of about 2996° C.), platinum (Pt) (melting point of about 1772° C.), chromium (Cr) (melting point of about 1857° C.), nickel (Ni) (melting point of about 1453° C.), or combinations of these metals may be used also. In any event, the term "high-temperature resistant alignment mark" as it will be used in this application refers to an alignment mark which includes at least a conductive material with a melting temperature higher than an annealing temperature used to formed empty-spaced buried patterns in the substrate material by methods described in more detail below. Thus, for a monocrystalline silicon substrate, such as the silicon substrate 10 of the present invention, a high-temperature resistant alignment mark formed by a method of the present invention includes a conductive material capable of remaining intact at temperatures higher than about 1100° C., which, as it will be explained below, is the annealing temperature for forming empty-spaced patterns in a monocrystalline silicon substrate. Such annealing temperature is, in turn, lower than the melting point of monocrystalline silicon, which is about 1400° C.

Figure 4:
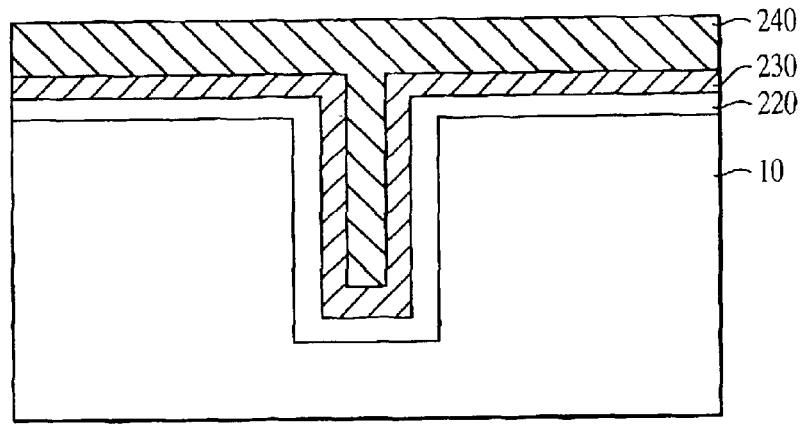
FIG. 4 illustrates a cross-sectional view of the alignment mark of FIG. 1 at a stage of processing subsequent to that shown in FIG. 3.

Referring now to FIG. 4, an insulating layer 240 of, for example, silicon nitride ($Si_3N_4$) or an oxide such as silicon dioxide ($SiO_2$), is formed overlying the conductive material layer 230 and filling completely the trench 210. The insulating layer 240 may be formed by conventional deposition methods to a thickness of about 100 Angstroms to about 1,500 Angstroms, more preferably of about 300 Angstroms.

Subsequent to the formation of the insulating layer 240, portions of the oxide layer 220, the conductive material layer 230, and the insulating layer 240 that are formed overlying the silicon substrate 10 are etched back by means of chemical mechanical polishing (CMP) or well-known RIE dry etching processes. In a preferred embodiment, chemical mechanical polishing is employed, so that an abrasive polish removes the top surface of the insulating layer 240 as well as the horizontal portions of the oxide layer 220 and the conductive material layer 230 down to or near the planar surface of the surface of the silicon substrate 10, as illustrated in FIG. 5. This way, a high-temperature resistant alignment mark 200 is formed on the silicon substrate 10 with an alignment edge D having a width determined by the thickness of the conductive material layer 230. For a better understanding, a top view of the square alignment mark 200 is illustrated in FIG. 6.

Reference is now made to FIGS. 10–20, which illustrate exemplary embodiments of buried silicon structures 100 comprising buried conductor patterns formed within the silicon substrate 10 and aligned relative to the square alignment mark 200 (FIGS. 5–6). To understand, however, the formation of such buried conductor patterns, reference is first made to FIGS. 7–10 which illustrate the formation of empty-space patterns on which the buried conductor patterns of the present invention will be formed and aligned. Techniques for the formation of empty-spaced patterns of different geometries are described by Sato et al., in *Substrate Engineering for the Formation of Empty Space in Silicon (ESS) Induced by Silicon Surface Migration*, 1999 IEDM Digest, Paper 20.6.1, the disclosure of which is incorporated by reference herein.

Empty spaces which are formed in silicon substrates and have various shapes, such as plates, spheres or pipes, may be formed as a result of the self-organizing migration properties on the silicon surface. As such, when deeply-etched silicon substrates are annealed in a hydrogen ambient, for example, the silicon atoms on the surface migrate so that their surface energy is minimized. Based on these findings, Sato et al. have demonstrated that the geometry of empty spaces, such as spheres, plates and pipes, formed under the surface of a silicon substrate depends on the size, number and spacing of a plurality of cylindrical holes that are initially formed at a low temperature.

For example, FIGS. 7(a)–(f) illustrate how a single sphere-shaped empty space 13 is formed from a single cylindrical hole 12 formed within the silicon substrate 10. Subsequent to the formation of the cylindrical hole 12, the silicon substrate 10 is annealed at a temperature lower than the melting point of monocrystalline silicon (1400° C.), for example, at a temperature of about 1100° C. Sato et al. have demonstrated that, within about 60 seconds and under a reducing ambient of 10 Torr of hydrogen, the shape and surface morphology of the cylindrical hole 12 changes drastically to that of the sphere-shaped empty space 13 (FIG. 7(f)). Because of the significant surface and/or volume diffusion which occurs at high annealing temperatures, the cylindrical hole 12 is unstable beyond a critical length Lc and transforms, therefore, to a lower energy state consisting of one or more empty spheres formed along the original cylinder axis.

As analyzed by Nichols et al., in *Surface- (Interface-) and Volume-Diffusion Contributions to Morphological Changes Driven by Capillarity*, Trans. AIME 233 at 1840 (October 1965), the disclosure of which is incorporated by reference herein, when Lc corresponds to the surface diffusion state, the number N of empty spheres that form from a cylindrical hole depends both on the length L of the cylindrical hole and on the cylinder radius Rc. Accordingly, the number N of empty spheres formed from a cylindrical hole made in a silicon substrate could be estimated according to the following equation:

$$8.89RcN<L<8.89Rc(N+1) \quad (1)$$

wherein: N=number of empty spheres;
Rc=cylinder radius; and
L=length of cylindrical hole Thus, equation (1) predicts that, if L<8.89 Rc, the number of empty spheres will be N=0, which means that no empty spheres will form from a cylindrical hole.

When one or more empty spheres form with a radius Rs, then according to Nichols et al., the value of Rs is given by the following equation:

$$Rs=1.88Rc \quad (2)$$

wherein: Rs=sphere radius; and
Rc=cylinder radius

When two or more empty spheres form from a cylinder hole with a cylinder radius Rc, then the distance λ between the centers of two adjacent empty-spaced spheres is calculated from the following formula:

$$\lambda=8.89Rc \quad (3)$$

wherein: λ=center-to-center distance between two adjacent spheres; and
Rc=cylinder radius Reference is now made to FIGS. 8(a)–(c), which exemplify the formation of a single pipe-shaped empty space 23 from a linear array of cylindrical holes 22. Similarly, FIGS. 9(a)–(b) illustrate the formation of a single plate-shaped empty space 33 from a two-dimensional array of cylindrical holes 32 formed within a silicon substrate such as the silicon substrate 10. The values of the pipe radius Rp (of the pipe-shaped empty space 23) and that of the plate thickness Tp (of the plate-shaped empty space 33) may be calculated in a manner similar to that described above with reference to the formation of the empty sphere 13 and the calculation of sphere radius Rs in equation (2). The distance Δ between the centers of any two adjacent cylindrical holes 22, 32, in a linear array, may be calculated from the following formula:

$$2Rc<\Delta<3.76Rc \quad (4)$$

wherein: Rc=cylinder radius; and
Δ=center-to-center distance between two adjacent cylinder holes in a linear array Equation (4) ensures that adjacent cylindrical holes 22, 32 do not touch each other allowing, therefore, the formation of a plurality of adjacent spheres that combine to form the resulting pipe-shaped empty space 23 and plate-shaped empty space 33.

The values of the pipe radius Rp and of the plate thickness Tp are given by the following two expressions:

$$Rp=(8.86Rc^3/\Delta)^{1/2} \quad (5)$$
$$Tp=27.83Rc^3/\Delta^2 \quad (6)$$

wherein: Rp=pipe radius;
Tp=plate thickness; and
Δ=center-to-center distance between two adjacent cylinder holes in a linear array Reference is now made to FIG. 10 which, for simplicity, illustrates a cross-sectional view of structure of FIG. 8(a) on which a plurality of linear cylindrical holes 22 are drilled into silicon substrate 10 which also includes high-temperature alignment marks, such as the alignment mark 200 (FIGS. 5–6), the formation of which was described above. The linear cylindrical holes 22 are drilled into silicon substrate 10 from an upper surface 11 of the substrate 10 to a depth D1. The silicon substrate 10 is annealed at a temperature of about 1100° C. and under a reducing ambient of about 10 Torr of hydrogen so that within about 60 seconds a pipe-shaped empty space 23 is formed within the silicon substrate 10 as shown in FIG. 11.

Radius R1 (FIG. 10) of each of the cylindrical holes 22 and distance Δ1 (FIG. 10) between the center of two adjacent cylindrical holes 22 may be calculated in accordance with equation (4). It must be understood that the length L1 (FIG. 10) of the array of the cylindrical holes 22 determines the length L1 (FIG. 11) of the pipe-shaped empty space 23, wherein the depth D1 (FIG. 10) to which the array of cylindrical holes 22 is drilled determines the depth D1 (FIG. 11) at which the pipe-shaped empty space 23 is formed. Both parameters define a location where a first level conductor 70 (FIGS. 19–20), will be formed as described in more detail below. Finally, the radius Rp of the pipe-shaped empty space 23 (FIG. 11) may be calculated in accordance with equation (5).

Figure 11:
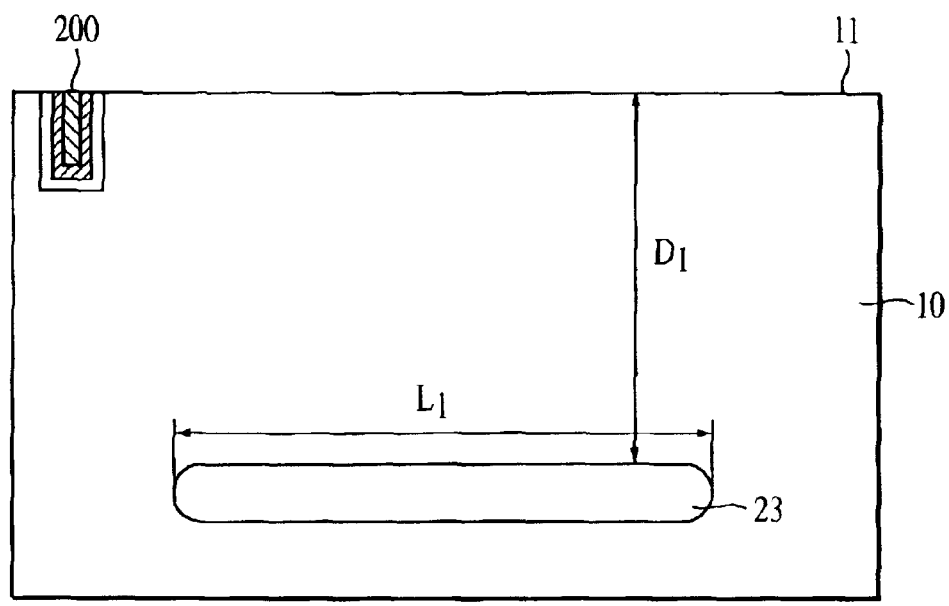
FIG. 11 is a cross-sectional view of the silicon structure of FIG. 10 according to the present invention at a stage of processing subsequent to that shown in FIG. 10.
Figure 12:
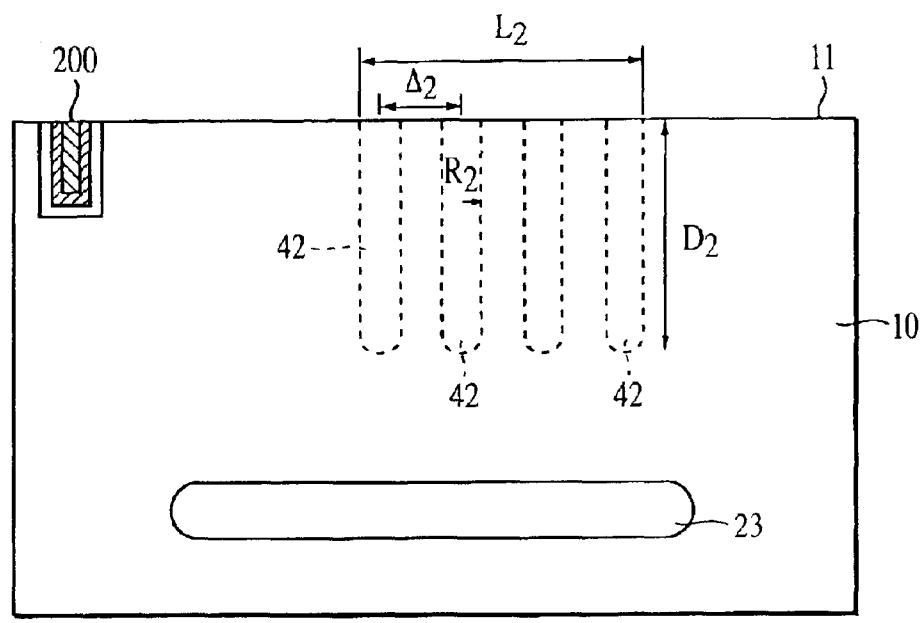
FIG. 12 is a cross-sectional view of the representative silicon structure according to the present invention at a stage of processing subsequent to that shown in FIG. 11.

Subsequent to the formation of the pipe-shaped empty space 23, a second pipe-shaped empty space 43 (FIG. 13) may be formed above the pipe-shaped empty space 23 and below the silicon surface 11 by a technique similar to that described for the formation of the pipe-shaped empty space 23 (FIG. 11). As such, a second linear array of cylindrical holes 42 (FIG. 12) are drilled into the silicon substrate 10 to a depth D2 to define the intended location, length and orientation of a second level conductor 80 (FIGS. 19–20), the formation of which will be described in more detail below. The relative positioning between the pipe-shaped empty space 23 (FIG. 11) and the second linear array of cylindrical holes 42 (FIG. 12) is accomplished by reference to the alignment mark 200. This way, the second linear array of cylindrical holes 42 is accurately aligned to the already formed pipe-shaped empty space 23.

The silicon substrate 10 is then annealed at a temperature of about 1100° C. and under a reducing ambient of about 10 Torr of hydrogen, so that within about 60 seconds the second linear array of cylindrical holes 42 transforms into the second pipe-shaped empty space 43 (FIG. 13) by steps similar to those described above with reference to FIGS. 8(a)–(c).

Radius R2 (FIG. 12) as well as distance Δ2 (FIG. 12) between the center of two adjacent cylindrical holes 42 of the second linear array may be calculated in accordance to equation (4). Further, the length L2 (FIG. 12) of the second linear array of cylindrical holes determines the length L2 (FIG. 13) of the second pipe-shaped empty space 43, wherein the depth D2 (FIG. 12) to which the second linear array of cylindrical holes is drilled determines the depth D2 (FIG. 13) at which the second pipe-shaped empty space 43 is formed within the silicon substrate 10.

Figure 13:
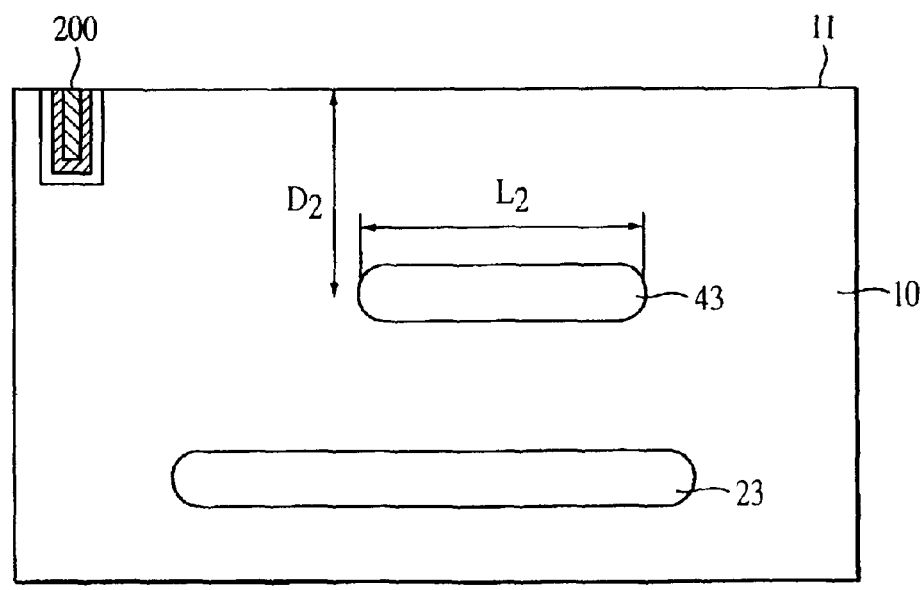
FIG. 13 is a cross-sectional view of the representative silicon structure according to the present invention at a stage of processing subsequent to that shown in FIG. 12.
Figure 14:
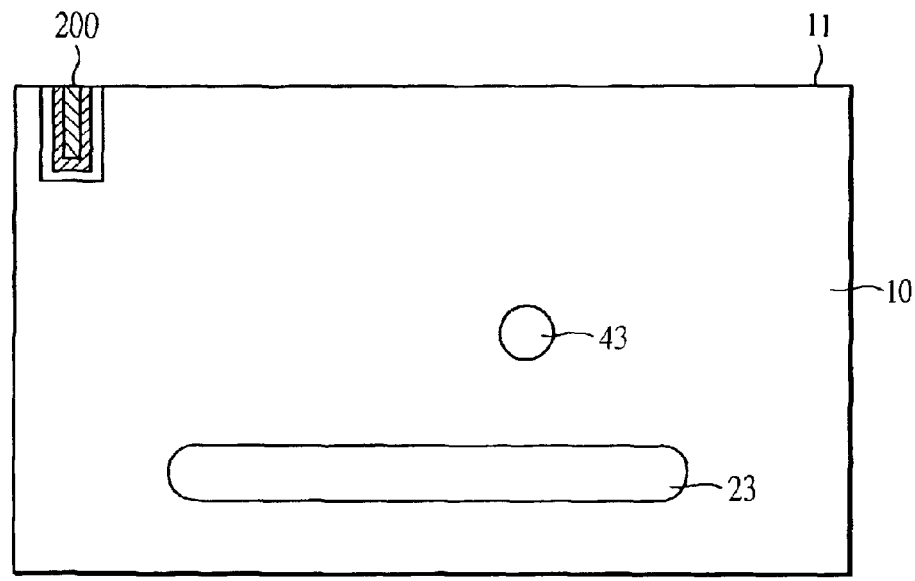
FIG. 14 is a cross-sectional view of the representative silicon structure according to a second embodiment of the present invention at a stage of processing subsequent to that shown in FIG. 12.

Although FIG. 13 illustrates the second pipe-shaped empty space 43 as being parallel to the pipe-shaped empty space 23, it must be understood that the second pipe-shaped empty space 43 need not be parallel to the pipe-shaped empty space 23 but may form various angles and may be placed in various directions with respect to the pipe-shaped empty space 23, according to the characteristics of the IC device to be formed. For example, FIG. 14 illustrates the second pipe-shaped empty space 43 forming a 90 degree angle with the pipe-shaped empty space 23.

Figure 15:
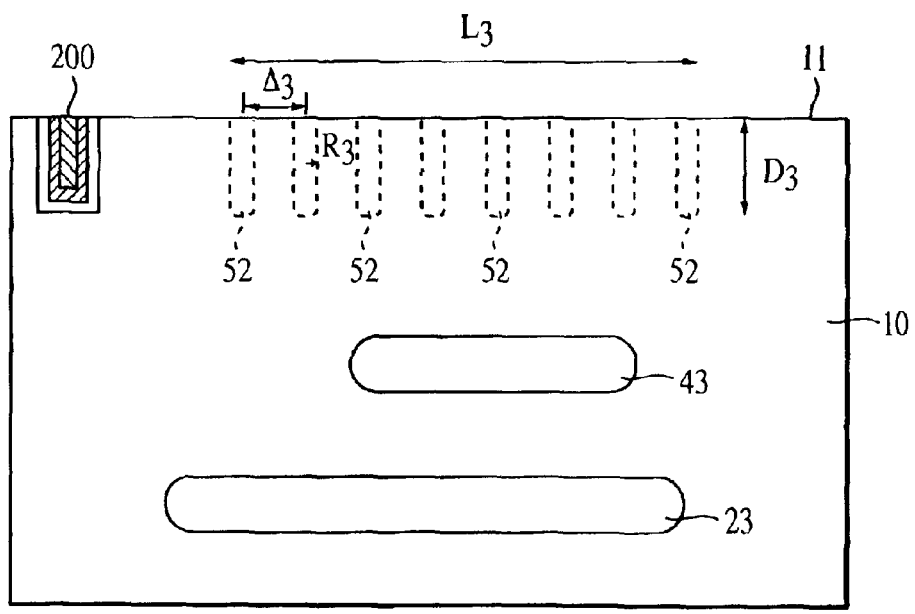
FIG. 15 is a cross-sectional view of the representative silicon structure according to the present invention at a stage of processing subsequent to that shown in FIG. 13.
Figure 16:
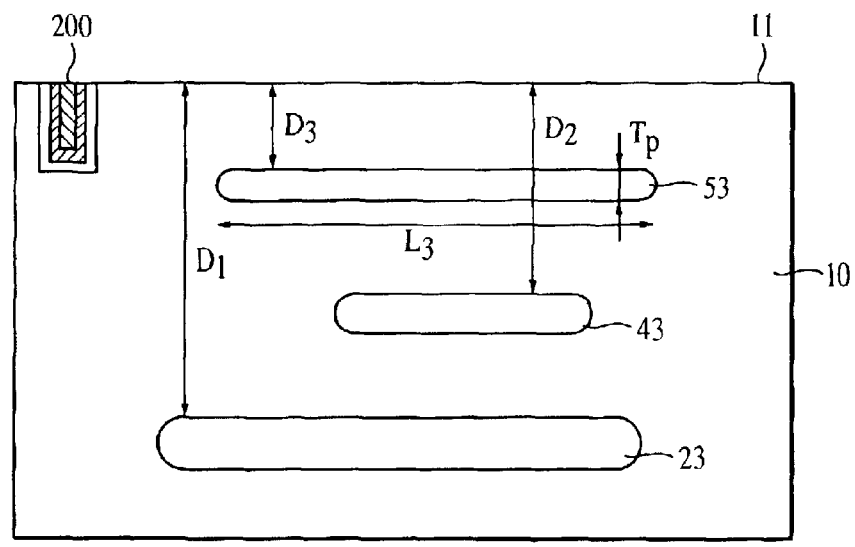
FIG. 16 is a cross-sectional view of the representative silicon structure according to the present invention at a stage of processing subsequent to that shown in FIG. 15.

FIG. 15 illustrates the formation of a two-dimensional array of cylindrical holes 52 located in between the upper silicon surface 11 and the second pipe-shaped empty space 43 which will form a plate-shaped empty space 53 (FIG. 16) aligned relative to the alignment mark 200. Again, the silicon substrate 10 is annealed at a temperature of about 1100° C. and under a reducing ambient of about 10 Torr of hydrogen, so that within about 60 seconds the two-dimensional array of cylindrical holes 52 transforms into the plate-shaped empty space 53 (FIG. 16) by steps similar to those described above with reference to FIGS. 9(a)–(b). For a better understanding of the invention, the structures of FIG. 16 are illustrated in a three-dimensional view in FIG. 17.

Radius R3 (FIG. 15) as well as distance Δ3 (FIG. 15) between the center of two adjacent cylindrical holes 52 of the two-dimensional array may be calculated in accordance to equation (4). Further, the length L3 (FIG. 15) of the two-dimensional array of cylindrical holes determines the length L3 (FIG. 16) of the plate-shaped empty space 53, wherein the depth D3 (FIG. 15) to which the two-dimensional array of cylindrical holes is drilled determines the depth D3 (FIGS. 16–17) at which the plate-shaped empty space 53 is formed within the silicon substrate 10. Finally, the thickness Tp (FIGS. 16–17) of the plate-shaped empty space 53 may be calculated in accordance with equation (6). This plate-shaped empty region may be left empty in some areas, so that the region above the plate becomes a silicon-over-nothing area where various IC devices can then be formed. Alternatively, the plate-shaped empty region may be also filled with a conductor, as it will be described in more detail below, to provide a plate-shaped conductor region.

Subsequent to the formation of the first pipe-shaped empty space 23, second pipe-shaped empty space 43, and plate-shaped empty space 53, additional interconnect structures and associated dielectric layers could be formed to create operative electrical paths down from the empty-spaced structures formed within the silicon substrate 10 and up to the silicon surfaces, such as the upper silicon surface 11, and any IC devices formed thereon. These additional interconnect structures and associated dielectric layers are also aligned with the previous empty space structures 23, 43, 53 by reference to the alignment mark 200. For example, the aligning method of the present invention is further explained below with reference to the formation and alignment of buried conductor patterns 70, 80, 90 (FIG. 20) relative to the alignment mark 200.

Figure 18:
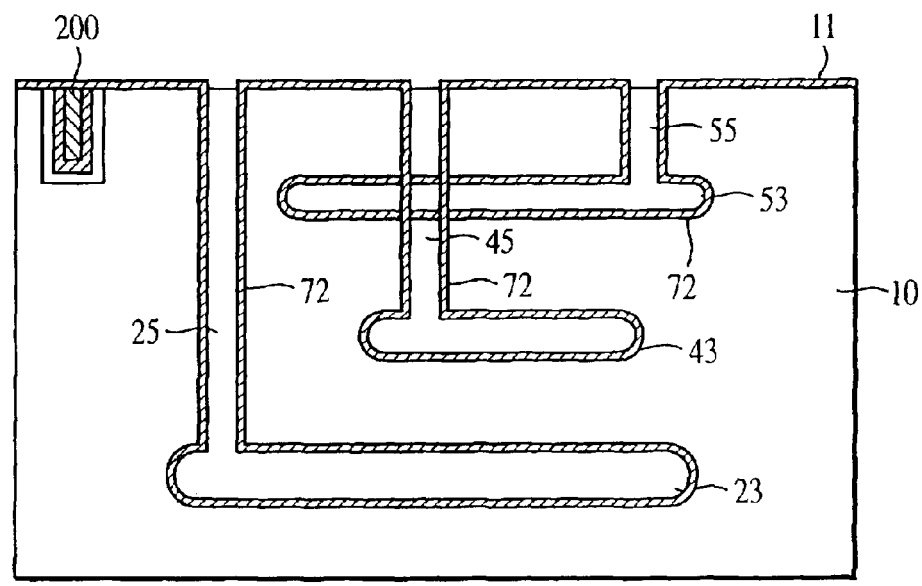
FIG. 18 is a cross-sectional view of the representative silicon structure according to the present invention at a stage of processing subsequent to that shown in FIG. 16.

Accordingly, as illustrated in FIG. 18, a plurality of interconnect holes 25, 45, 55 are drilled within the silicon substrate 10 to connect each of the first pipe-shaped empty space 23, the second pipe-shaped empty space 43, and the plate-shaped empty space 53 with the upper silicon surface 11. The structure of FIG. 18 is then subjected to a conventional oxidizing atmosphere, for example an ozone oxidizing atmosphere or water vapor is heated and passed over the substrate at about 600–700° C., so that the inner surfaces of the above-described patterns, as well as the interconnect holes 24, 45, 55, are oxidized to prevent any leakage between conductors formed in areas 23, 43, 53, the substrate and any active devices that will be eventually fabricated over the silicon substrate 10.

Alternatively, or in addition to the oxidizing atmosphere, a barrier layer 72 may be formed on surfaces of the silicon substrate 10, within each of the interconnect holes 24, 45, 55, and on the inner surfaces of each of the first pipe-shaped empty space 23, the second pipe-shaped empty space 43, and the plate-shaped empty space 53, as also shown in FIG. 18. The barrier layer 72 may be formed by CVD, PVD, sputtering or evaporation, to a thickness of about 50 Angstroms to about 100 Angstroms.

Preferred materials for the barrier layer 72 are metals, such as titanium (Ti), zirconium (Zr), tungsten (W), or hafnium (Hf), or metal compounds, such as tantalum nitride (TaN) or silicon nitride ($Si_3N_4$). If desired, the barrier layer 72 may be formed of refractory metal compounds, such as refractory metal nitrides (for example TiN and HfN), refractory metal carbides (for example TiC or WC), or refractory metal borides (for example TiB or MoB). The selection of a material for the barrier layer 72 depends upon the specific conductor to be deposited and the method which is chosen to deposit such conductor. In turn, the selection of the conductor material will depend upon the type and temperature of subsequent processing steps. For example, aluminum (Al) would not be chosen as the conductor material if the subsequent processing steps require temperatures above approximately 600° C. Similarly, tungsten (W) would be a preferred conductor for temperatures above approximately 1000° C. In any event, the barrier layer 72 suppresses the diffusion of the metal atoms from the subsequently deposited conductive material (FIG. 20), while offering a low resistivity and low contact resistance between the subsequently deposited conductive material (FIG. 20) and the barrier layer 72.

Although in an exemplary embodiment of the invention the barrier layer 72 is simultaneously deposited in the interconnect holes 24, 45, 55, and on the inner surfaces of each of the first pipe-shaped empty space 23, the second pipe-shaped empty space 43, and the plate-shaped empty space 53, the invention is not limited to this embodiment. For example, the barrier layer 72 may be deposited first in the interconnect hole 24 and its corresponding pipe-shaped empty space 23, before the formation of the interconnect hole 45 and its corresponding second pipe-shaped empty space 43, and before the formation of the interconnect hole 55 and its corresponding plate-shaped empty space 53. In this embodiment, the barrier layer 72 may be formed of a first barrier material corresponding to the pipe-shaped empty space 23, of a second barrier material corresponding to the second pipe-shaped empty space 43, and of a third barrier material corresponding to the plate-shaped empty space 53. The first, second and third barrier materials may be the same or different, depending on the characteristics of the IC device.

Figure 19:
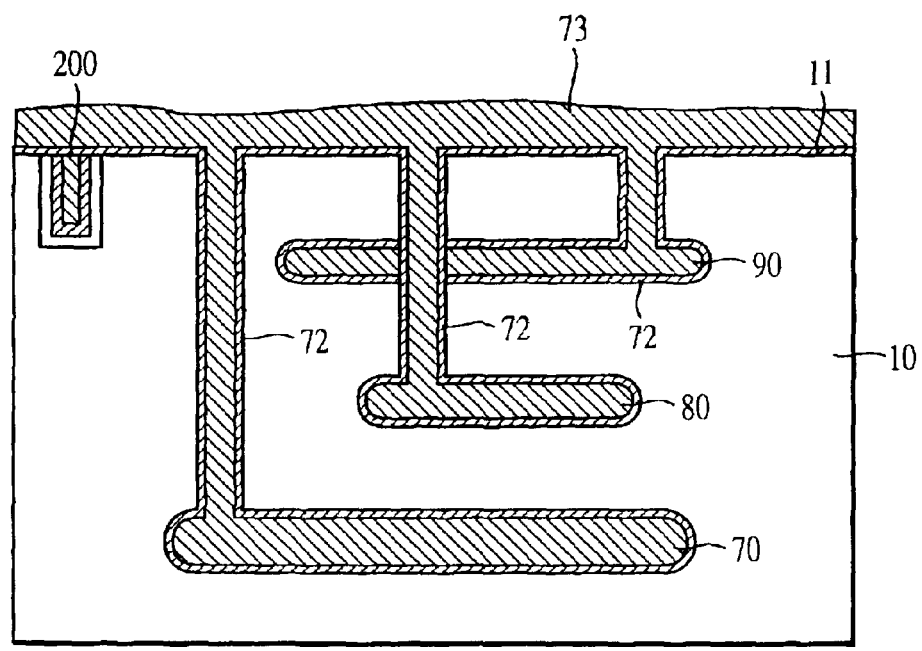
FIG. 19 is a cross-sectional view of the representative silicon structure according to the present invention at a stage of processing subsequent to that shown in FIG. 18.

As illustrated in FIG. 19, a conductive material 73 is next deposited to fill in the interconnect holes 24, 45, 55, as well as the first pipe-shaped empty space 23, the second pipe-shaped empty space 43, and the plate-shaped empty space 53. In a preferred embodiment of the invention, the conductive material 73 comprises either copper, silver, gold, tungsten or aluminum, but it must be understood that other conductive materials and/or their alloys may be used also. In any event, the conductive material 73 may be blanket deposited by a substitution technique, as described in U.S. Pat. Nos. 5,920,121; 6,100,176; 6,121,126, and U.S. application Ser. No. 09/069,346 filed Apr. 29, 1998 (disclosure of which is incorporated by reference). Alternatively, the conductive material 73 may be also blanket deposited by a known PVD, CVD, or a combination of these techniques to fill in all three interconnect holes 24, 45, 55 and their associated first pipe-shaped empty space 23, second pipe-shaped empty space 43, and plate-shaped empty space 53 to form a first buried conductor pattern 70, a second buried conductor pattern 80, and a third buried conductor pattern 90, all illustrated in FIG. 20. Alternatively, the conductive material 73 may be deposited by a plating technique.

Figure 20:
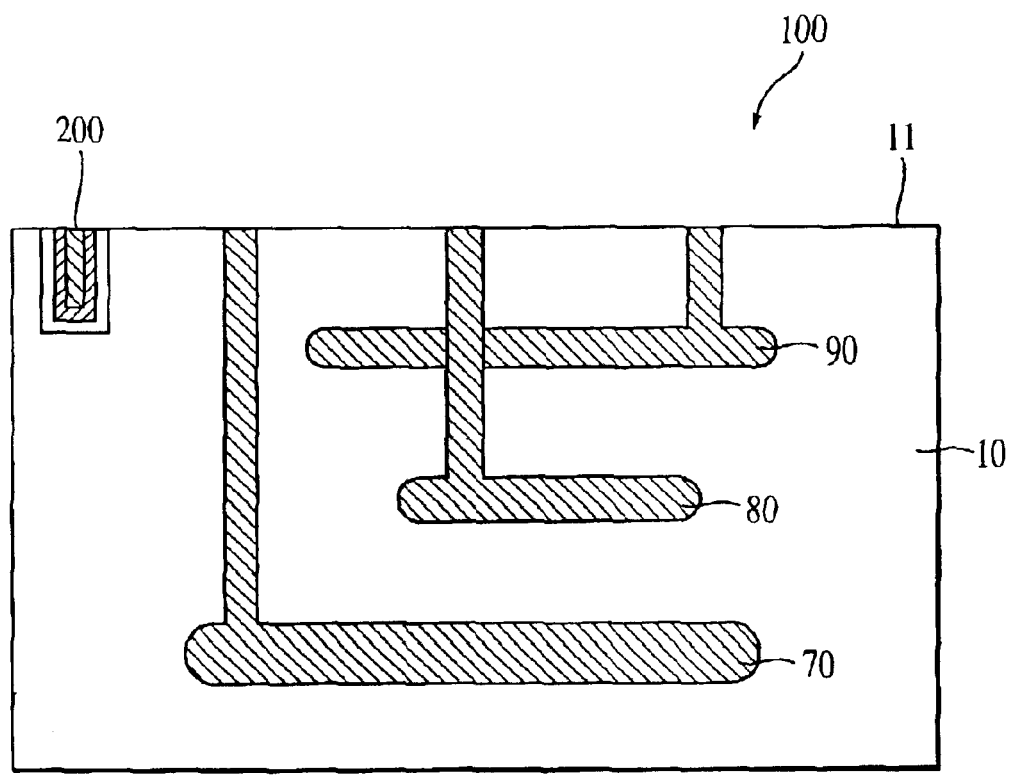
FIG. 20 is a cross-sectional view of the representative silicon structure according to the present invention at a stage of processing subsequent to that shown in FIG. 19.

After the deposition of the conductive material 73, excess barrier material and excess metal formed above the upper silicon surface 11 and over the alignment mark 200 may be removed by either an etching or a polishing technique to form the buried silicon structure 100 illustrated in FIG. 20. In an exemplary embodiment of the present invention, chemical mechanical polishing (CMP) is used to polish away excess barrier and conductive materials above the upper silicon surface 11 of the silicon substrate 10.

Although the buried silicon structure 100 is shown in FIG. 20 as comprising only three buried conductor patterns 70, 80, and 90, respectively, it must be readily apparent to those skilled in the art that in fact any number of such buried conductor patterns may be formed on the substrate 10, as pipes, plates, or spheres and aligned relative to the alignment mark 200, by methods of the present invention. Also, although the exemplary embodiments described above refer to the formation of buried conductor patterns having specific shapes, it must be understood that other shapes, configurations or geometries may be employed, depending on the characteristics of the particular IC device to be fabricated and as long as they are accurately aligned with the previously formed patterns. Further, the invention is not limited to a combination of three buried conductor patterns, but any combination of any number of empty-spaced patterns filled with a conductor may be employed, as desired.

Figure 17:
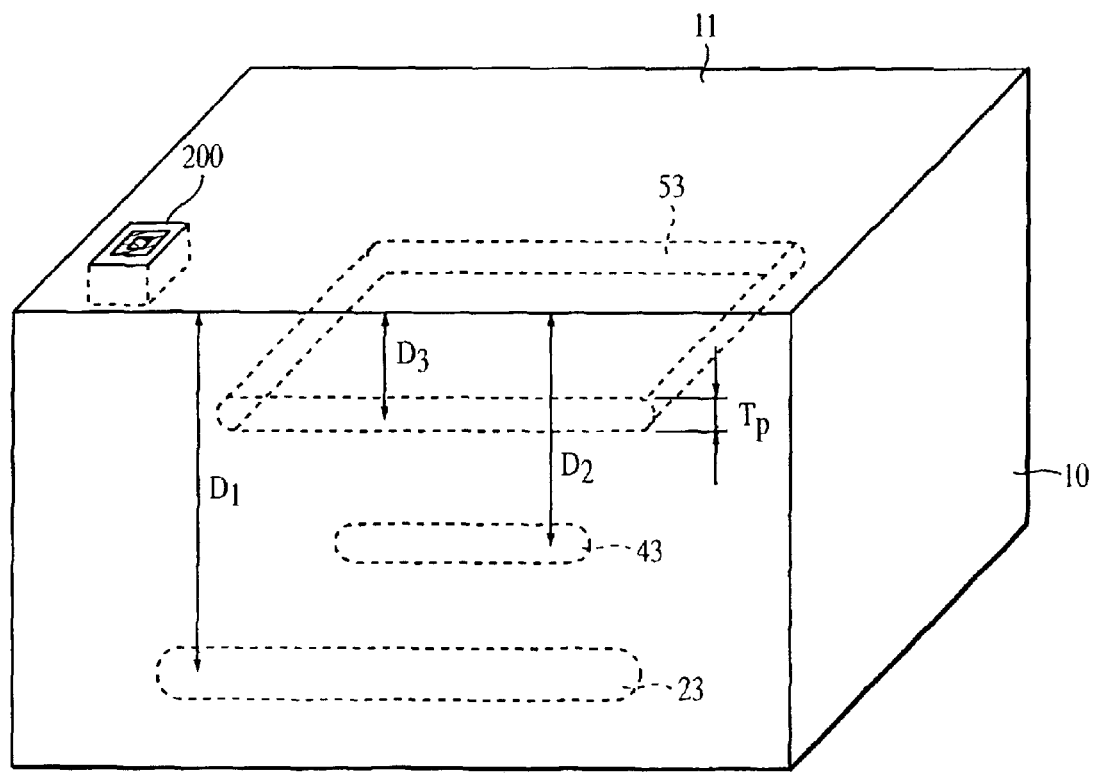
FIG. 17 is a three-dimensional view of the representative silicon structure of FIG. 16.

The processing steps of the present invention may be also reduced if the lower level buried conductor patterns do not cross over each other below upper level buried patterns, such as the plate-shaped empty space 53 (FIGS. 16–18). In this case, all buried conductor patterns located below the plate-shaped empty space 53 may be simultaneously aligned and formed during the same annealing/heating cycle, to reduce therefore the number of processing steps during the fabrication of the buried silicon structure 100.

In addition, further steps to create a functional memory cell on the silicon substrate 10 may be carried out. Thus, additional multilevel interconnect layers and associated dielectric layers could be formed to create operative electrical paths from the buried silicon structure 100 to a source/drain region (not shown) adjacent to a transistor gate structure (not shown) of the substrate 10. These additional multilevel interconnect layers and associated dielectric layers may be also positioned and aligned with the buried conductor patterns 70, 80, 90 (FIG. 20) with reference to the mark 200, to minimize misalignment between the IC layers. The resulting substrate containing the buried conductors can be used in the formation of many types of integrated circuits such as memories, for example, DRAMs, processors etc. Thus, the invention provides a technique for forming buried conductors in semiconductor substrates which are aligned relative to an high-temperature alignment mark and may be further used, for example, as interconnects to various structures and devices in an integrated circuit.

Figure 21:
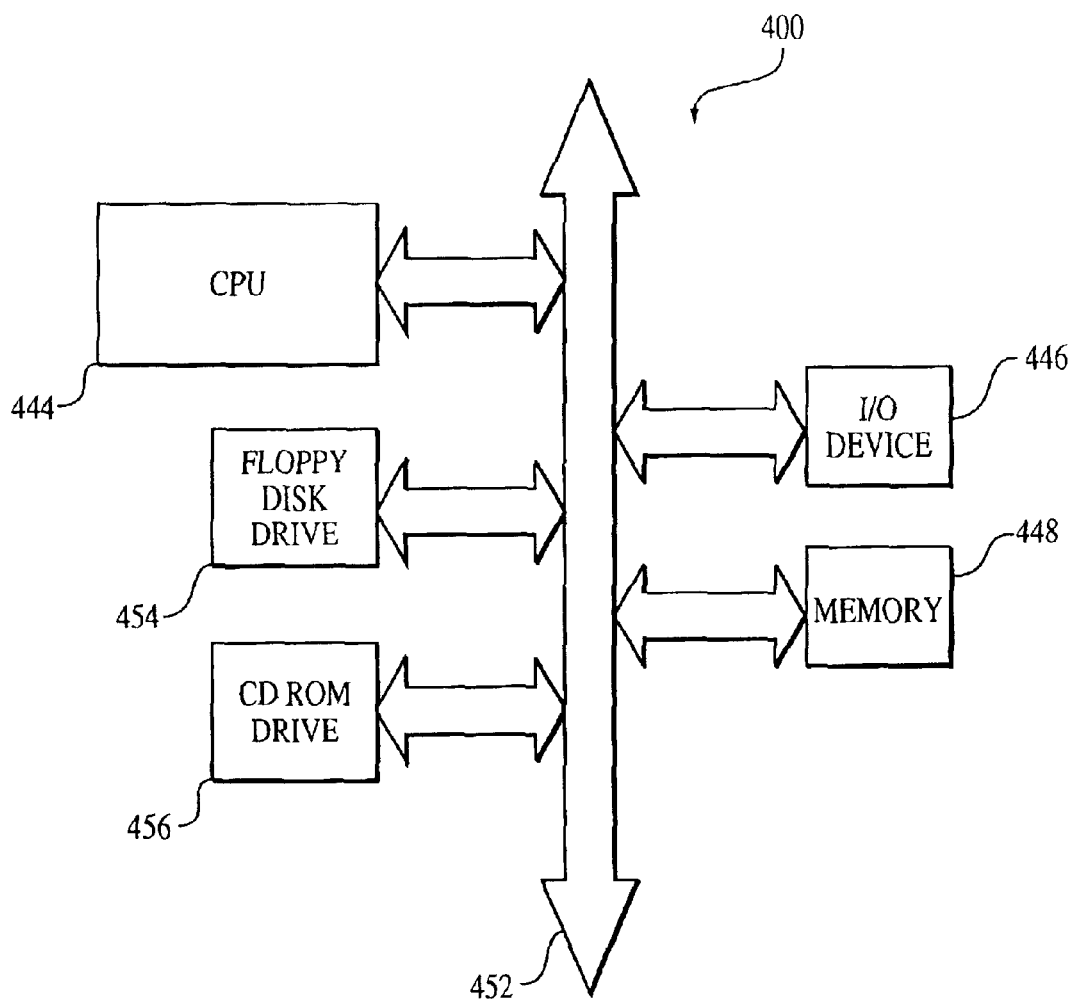
FIG. 21 is a schematic diagram of a processor system incorporating a silicon structure with an alignment mark of the present invention.

A typical processor-based system 400 which includes a memory circuit 448, for example a DRAM, is illustrated in FIG. 21. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448, the CPU 444 or others of the illustrated electrical structures may be constructed as an integrated circuit, which includes one or more buried silicon structures 100 aligned relative to the high-temperature alignment mark 200 in accordance with the invention. If desired, the memory 448 may be combined with the processor, for example CPU 444, in a single integrated circuit.

The above description and drawings are only to be considered illustrative of exemplary embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. An integrated circuit substrate comprising at least one empty-spaced pattern provided beneath a surface of, and within, a semiconductor substrate, said empty-spaced pattern being completely surrounded by semiconductor material of said semiconductor substrate, said empty-spaced pattern being aligned with respect to an alignment mark, said alignment mark including a conductive material with a melting point higher than an annealing temperature used to form said at least one empty-spaced pattern.

2. The integrated circuit of claim 1, wherein said empty-spaced pattern has a pipe-shaped pattern.

* * * * *